United States Patent
Yoo

(10) Patent No.: US 7,691,650 B2
(45) Date of Patent: Apr. 6, 2010

(54) THIN FILM LIGHT EMITTING DIODE

(75) Inventor: Myung Cheol Yoo, Pleasanton, CA (US)

(73) Assignee: LG Electronics Inc., Seoul (KR)

(*) Notice: Subject to any disclaimer, the term of this patent is extended or adjusted under 35 U.S.C. 154(b) by 0 days.

(21) Appl. No.: 10/975,095

(22) Filed: Oct. 28, 2004

(65) Prior Publication Data

US 2005/0093004 A1 May 5, 2005

Related U.S. Application Data

(62) Division of application No. 10/179,010, filed on Jun. 26, 2002, now Pat. No. 6,841,802.

(51) Int. Cl.
*H01L 21/00* (2006.01)

(52) U.S. Cl. ................. 438/22; 257/E51.018

(58) Field of Classification Search .......... 257/79, 257/89, 98, 96, 101, 102, 103, E51.018, E51.022, 257/E51.122; 438/22, 24, 26, 27, 29, 35, 438/45, 38

See application file for complete search history.

(56) References Cited

U.S. PATENT DOCUMENTS

| | | | |
|---|---|---|---|
| 3,774,086 A | 11/1973 | Vincent, Jr. | |
| 3,875,456 A | 4/1975 | Kano et al. | |
| 5,198,795 A | 3/1993 | Shibasaki et al. | |
| 5,644,190 A * | 7/1997 | Potter | 313/336 |
| 5,684,309 A | 11/1997 | McIntosh et al. | |
| 5,739,554 A | 4/1998 | Edmond et al. | |
| 5,813,753 A | 9/1998 | Vriens et al. | |
| 5,847,507 A | 12/1998 | Butterworth et al. | |
| 5,929,466 A | 7/1999 | Ohba et al. | |
| 5,998,925 A | 12/1999 | Shimizu et al. | |
| 6,043,515 A | 3/2000 | Kamiguchi et al. | |
| 6,069,440 A * | 5/2000 | Shimizu et al. | 313/486 |
| 6,100,545 A | 8/2000 | Chiyo et al. | |
| 6,120,600 A | 9/2000 | Edmond et al. | |
| 6,277,301 B1 * | 8/2001 | Hohn et al. | 252/301.36 |
| 6,329,216 B1 | 12/2001 | Matsumoto et al. | |

(Continued)

OTHER PUBLICATIONS

Authors: Mensz, P. M.; Kellawon, P.; van Rojen, R.; Kozodoy, P.; Denbaars, S.; Title: "$In_xGa_{1-x}N/Al_yGa_{1-y}N$ Violet light emitting diodes with reflective p-contacts for high single sided light extraction"; Electronic Letters; Nov. 20, 1997; vol. 33—No. 24.

(Continued)

*Primary Examiner*—Davienne Monbleau
*Assistant Examiner*—Hoa B Trinh
(74) *Attorney, Agent, or Firm*—McKenna Long & Aldridge LLP

(57) ABSTRACT

Light emitting LEDs devices comprised of LED chips that emit light at a first wavelength, and a thin film layer over the LED chip that changes the color of the emitted light. For example, a blue LED chip can be used to produce white light. The thin film layer beneficially consists of a fluorescent material, such as a phosphor, and/or includes tin. The thin film layer is beneficially deposited using chemical vapor deposition.

25 Claims, 5 Drawing Sheets

U.S. PATENT DOCUMENTS

| | | |
|---|---|---|
| 6,335,217 B1 | 1/2002 | Chiyo et al. |
| 6,358,770 B2 | 3/2002 | Itoh et al. |
| 6,388,275 B1 | 5/2002 | Kang |
| 6,479,839 B2 | 11/2002 | Nikolaev et al. |
| 6,495,894 B2 | 12/2002 | Shibata et al. |
| 6,500,689 B2 | 12/2002 | Uemura et al. |
| 6,508,878 B2 | 1/2003 | Kim et al. |
| 6,600,175 B1 | 7/2003 | Baretz et al. |
| 6,614,060 B1 | 9/2003 | Wang et al. |
| 6,639,928 B2 | 10/2003 | Marion |
| 6,693,935 B2 | 2/2004 | Tojo et al. |
| 6,696,703 B2 | 2/2004 | Mueller-Mach et al. |
| 6,815,725 B2 * | 11/2004 | Sugawara et al. .............. 257/89 |
| 2001/0004112 A1 * | 6/2001 | Furukawa et al. .............. 257/7 |
| 2002/0043926 A1 * | 4/2002 | Takahashi et al. ........... 313/503 |
| 2004/0051105 A1 | 3/2004 | Tsuda et al. |

OTHER PUBLICATIONS

Michael Kneissl, et al., "Continuous-Wave Operation of InGaN Multiple-Quantum-Well Laser Diodes on Copper Substrates Obtained by Laser Liftoff," IEEE Journal on Selected Topics in Quantum Electronics, vol. 7, No. 2, Mar./Apr. 2001, pp. 188-191.

William S. Wong, et al., "The Integration of $In_xGa_{1-x}N$ Multiple-Quantum-Well Laser Diodes with Copper Substrates by Laser Lift-Off," Jpn. J. Appl. Phys. vol. 39, pp. L1203-L1205, Dec. 2000.

William S. Wong, et al., "Continuous-wave InGaN Multiple-Quantum-Well Laser Diodes on Copper Substrates," Applied Physics Letters, vol. 78, No. 9, Feb. 26, 2001, pp. 1198-1200.

* cited by examiner

THIN FILM LIGHT EMITTING DIODE

This application is a divisional of U.S. application Ser. No. 10/179,010 filed Jun. 26, 2002, now U.S. Pat. No. 6,841,802, and is hereby incorporated by reference for all purposes as if fully set forth herein.

BACKGROUND OF THE INVENTION

1. Field of the Invention

The present invention relates to diodes (LEDs), and more particularly, present invention relates to light emitting diodes LEDs.

2. Discussion of the Related Art

Light emitting diodes LEDs are well-known semiconductor devices that convert electrical current into light. An LED produces light by exciting electrons across the band gap between a conduction band and a valence band of a semiconductor active (light-emitting) layer. The electron transition generates light at a wavelength (color) that depends on the band gap. Thus, the color of the light (wavelength) emitted by an LED depends on the semiconductor material(s) of the active layer.

LEDs are widely available in a range of colors, for example, red, green, blue, yellow, and orange. However, conventional LEDs are relatively monochromatic light sources. Unfortunately, some applications require white light, which includes all primary colors. For example, laptop computers often require white-light backlights. Usually, white light is supplied either by incandescent bulbs or by fluorescent lamps. Although inexpensive, incandescent bulbs have fairly short lifetimes and low luminous efficiency. While more efficient, fluorescent lamps also tend to have limited lifetimes. Furthermore, fluorescent lamps require relatively large, heavy and expensive support devices, such as voltage stabilizers.

A white LED source could be made by fabricating closely spaced (or otherwise light-mixed) red, green, and blue LEDs that emit light in proper proportions. However, blue LEDs have been relatively difficult to fabricate, primarily because of difficulties in fabricating high quality crystals having a suitable band gap. Despite these difficulties, blue GaN-based LEDs have recently become commercially available. This has enabled white LEDs to actually be fabricated by mixing green, red and blue light together.

While successful in producing white light, three-component (green, red and blue) LEDs have problems. For example, three-component LEDs will use significantly more power than a single component LED. Additionally, three-component LEDs require careful balancing of optical outputs to achieve high quality white light, a balance that is difficult to maintain over time and temperature, and that requires careful and expensive fabrication. The necessity of optical balancing combined with a relatively complicated drive circuitry means that three-component LEDs are, in practice, difficult and expensive to fabricate.

Because of the forgoing problems with three-component LEDs it is would be advantageous to produce white light using only a single-element LED. Such single element white LEDs are known. For example, FIG. 1 illustrates a prior art single-element, white LED 12. The LED 12 incorporates an yttrium-aluminum garnet (YAG) phosphor. Essentially, the phosphor layer produces white light from blue light. As shown, the single element white LED 12 is comprised of a blue LED chip 14 that is located on a base 15, which is inside an organic YAG phosphor 16. The YAG phosphor 16 is embedded in a dome-shaped package 17 having a hemispherical top 18. The package 17 protects the resulting LED from damage caused by static electricity, moisture, and other environmental influences. Extending from the package 17 are two leads 20 and 22. Bonding wires 24 and 26 connect the anode and cathode of the LED chip 14 to the leads 20 and 22.

Still referring to FIG. 1, when electric power is applied to the LED chip 14 via the leads 20 and 22 and the bonding wires 24 and 26, the LED chip 14 emits blue light. A part of the blue light passes through the YAG phosphor 16, while another part is absorbed by the YAG phosphor 16. The result is white light from the package 17.

Thus, a key to making white LEDs using the method illustrated in FIG. 1 is suitable blue LEDs. A beneficial approach to fabricating such blue LEDs is to incorporate active layers comprised of Gallium-Nitride (GaN) and Indium to produce InGaN/GaN semiconductor layers. In fact, the energy efficiency of GaN-based white LEDs has surpassed that of incandescent lamps, and is now comparable with that of fluorescent lamps.

Despite their numerous advantages, white LEDs similar to the one shown in FIG. 1 have problems. One set of problems relates to degradation of the bonding wires 24 and 26, the LED chip 14, and the leads 20 and 22 due to direct contact and subsequent chemical reaction with the YAG phosphor 16. Additionally, the YAG phosphor 16 can be degraded by such chemical reactions.

Another problem with white LEDs similar to the one shown in FIG. 1 is that the hemispherical top 18 of the package 17 results in a "ring pattern" in the emitted light. Thus, the emitted light has poor luminance uniformity. The hemispherical top 18 also makes it difficult to reliably coat phosphors inside the package if such coating is required.

Another problem with white LEDs similar to the one shown in FIG. 1 is that the actual production of white light does not come from the light-producing LED chip 14, which emits only blue light, but from phosphor 16 within the package 17. Thus, the package not only provides protection, it is a functional requirement. Thus, the foregoing technique is not well suited for use with surface mount packaging.

U.S. Pat. No. 6,337,536, by inventors Matsubara et al., which issued on Jan. 8, 2002, and which is entitled, "White color light emitting diode and neutral color light emitting diode" discloses a white light emitting source that uses an n-type ZnSe single crystal substrate. The substrate is doped with I, Cl, Br, Al, Ga, or In emission centers, and includes an epitaxial film active layer structure of ZnSe, ZnCdSe or ZnSeTe. The active layer emits blue or blue-green light. The emission centers convert the blue or blue-green light to yellow or orange. The blue or blue-green light and the yellow or orange light synthesize white light or a neutral color light between red and blue.

While the techniques taught in U.S. Pat. No. 6,337,536 are generally successful, they have problems. For example, U.S. Pat. No. 6,337,536 teaches a thick substrate. Therefore, the light intensity is heavily dependent on the thickness of the substrate. Furthermore, the materials used in U.S. Pat. No. 6,337,536 may not be optimal in specific applications.

Therefore, a new single-element, white LED would be beneficial. Particularly beneficial would be a single-element, white LED that reduces or eliminates bonding wire, LED chip, connector lead, and phosphor degradation. Also beneficial would be a single-element, white LED that does not produce a ring pattern and that improves the uniformity of emitted light. Such a single-element, white LED would beneficially be fabricated as an on-chip, single-element, white LED that does not require a package for white light emissions. A method of fabricating white light emitting diodes without coating phosphor inside packages would be useful. Also beneficial would be a single-element, white LED with a light output that does not depend on the thickness of a substrate. More generally, a method of fabricating light emitting diodes using thin film fluorescent coatings would be beneficial.

BRIEF SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

The principles of the present invention provide for white LEDs and for methods of fabricating white LEDs. Embodiments of white LEDs that are in accord with the principles of the present invention have reduced or eliminated bonding wire, LED chip, lead, and/or phosphor degradation. Such white LEDs can be fabricated on-chip, with improved light uniformity, and in such a manner that the light output is not heavily dependent on the thickness of a substrate.

According to the broad principles of the present invention, an LED element that produces light at a first wavelength and having p and n contacts is fabricated on a substrate. Then, a tinted thin film covers the LED element. A passivation layer is located on the LED element, but in such a manner that the p and n contact pads are exposed. Electrical power applied to the p and n contacts causes the LED element to emit light at the first wavelength. The thin film converts light at the first wavelength to at least a second wavelength.

According to the principles of the present invention a white LED includes a blue-LED element that includes p and n contact pads. A thin film material, such as a phosphor (like YAG) or a tin-containing compound, covers the blue-LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods.

A passivation layer, beneficially about a 1000 Å-thick $SiO_2$ or $Si_xN_y$ layer, can be located on the blue-LED element, but in such a manner that the p and n contact pads are exposed. The passivation layer can be formed using PECVD, sputtering, electron beam evaporation, or coating with a material, such as epoxy or flowable $SiO_2$. PECVD is particularly beneficial in that it provides protected sidewalls. Spin-coating is a useful method of material coating. The passivation layer can then be patterned to expose the p and n contact pads using photolithography and a suitable etchant (such a BOE, HF, and/or photo-resist stripping).

Wire bonds connect to the p and n contact pads. A second passivation layer can be formed over the p and n pads, over ends of the wire bonds, and over the first passivation layer. The result is an on-chip, single-element, white LED that is capable of emitting white-light without being encapsulated. Furthermore, an on-chip, single-element, white LED can be formed without a ring-patterned light. However, the resulting on-chip, single-element, white LED could be encapsulated in a package (such as a lamp or surface mount package) as required.

According to the principles of the present invention, an LED includes an LED element that includes p and n contact pads and that emits light at a first wavelength. A fluorescent thin film material (such as a phosphor or a tin-containing material) covers the LED element. Such thin film materials are beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. A passivation layer, beneficially about a 1000 Å-thick $SiO_2$ or $Si_xN_y$ layer, can be located on the LED element, but in such a manner that the p and n contact pads are exposed. The fluorescing material converts light emitted by the LED element into at least a second wavelength.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE ILLUSTRATED EMBODIMENTS

The following generally describes a process for fabricating on-chip white LEDs. While that description is an advantageous method of fabricating white LEDs, the principles of the present invention are not limited to that described method. Accordingly, the present invention is to be limited only by the claims that follow as understood and interpreted according to United States Patent Laws.

Figure 1:
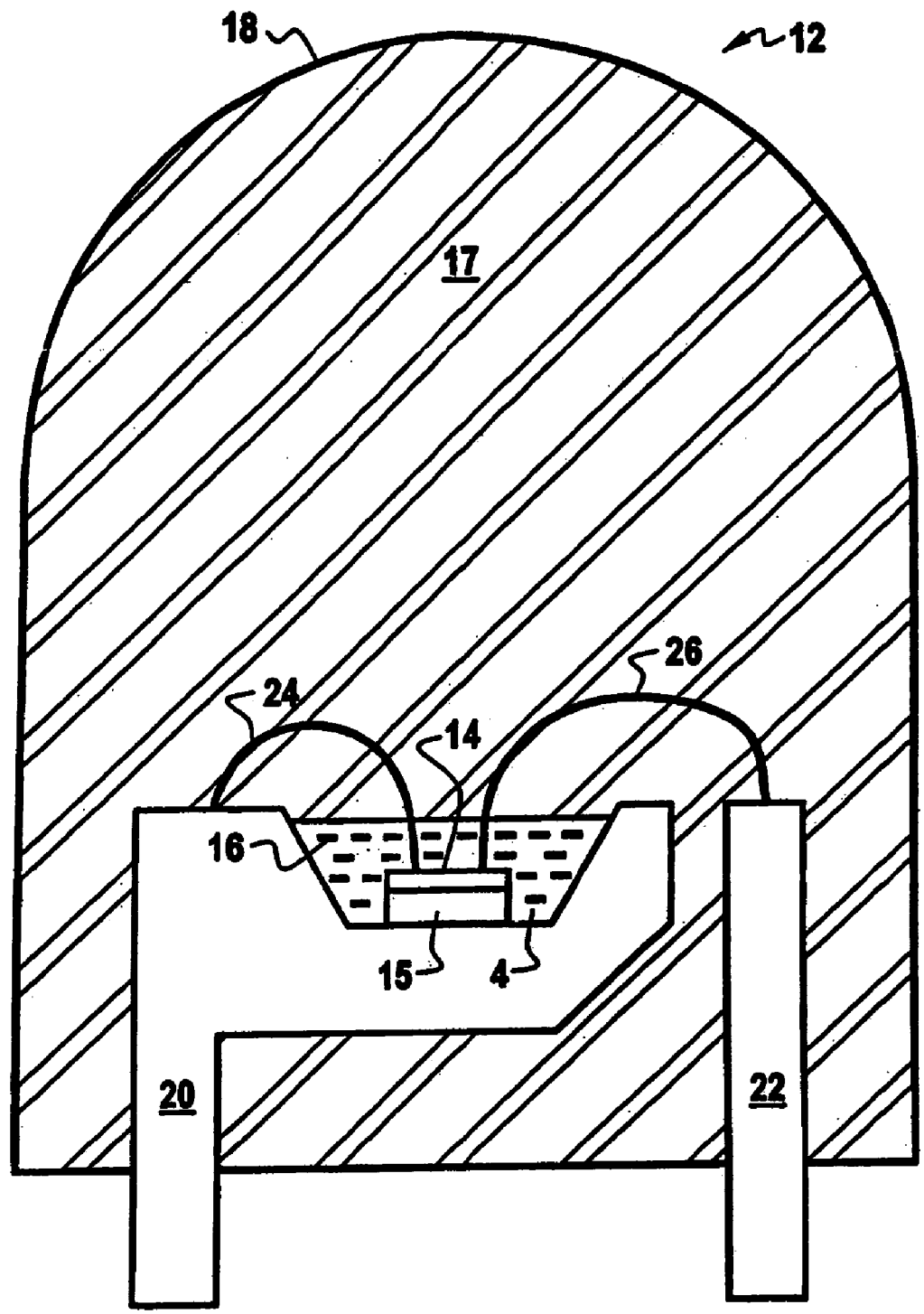
FIG. 1 illustrates a prior art white LED.
Figure 2:
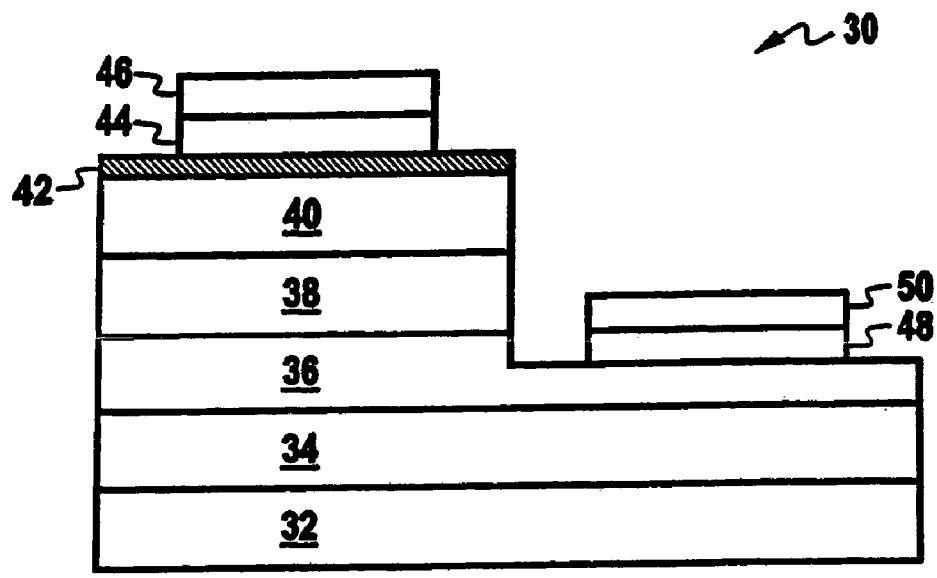
FIG. 2 illustrates a prior art lateral topology blue LED.
Figure 3:
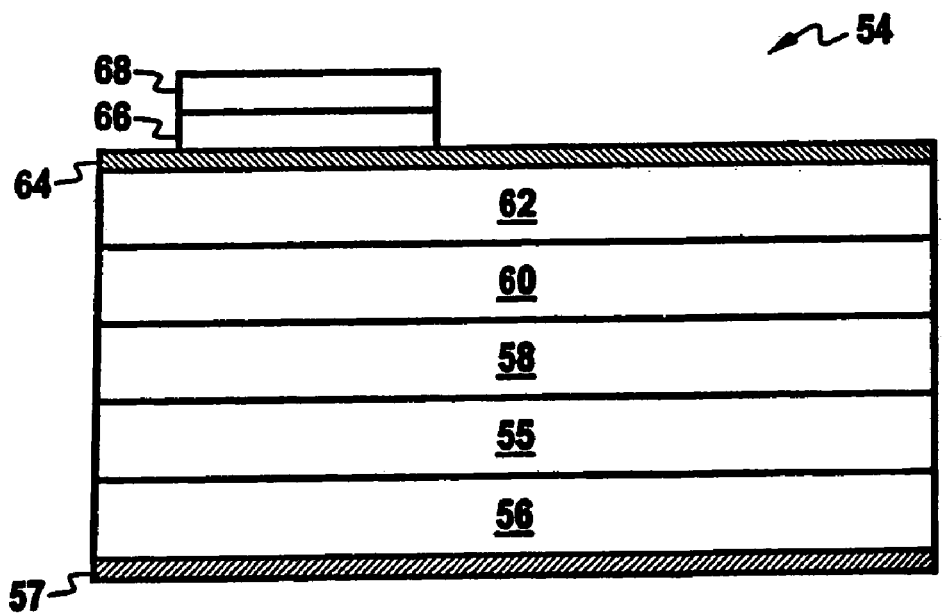
FIG. 3 illustrates a prior art vertical topology blue LED.

Fabrication of a white light emitting diode that is in accord with the principles of the present invention begins with procurement of, such as by fabrication, a blue-LED chip having p and n contact pads. FIGS. 2 and 3 illustrate suitable blue-LED chips. In particular, FIG. 2 illustrates a lateral topology blue-LED chip 30 that is fabricated on a sapphire substrate 32. An n-GaN buffer layer 34 is formed on the substrate 32. A relatively thick n-GaN epitaxial layer 36 is then formed on the buffer layer 34. An active layer 38 having multiple quantum wells of aluminum-indium-gallium-nitride (AlInGaN) or of InGaN/GaN is then formed on the n-type GaN epitaxial layer 36. A p-GaN layer 40 is then formed on the active layer 38. A transparent conductive layer 42 is then formed on the p-GaN layer 40. The transparent conductive layer 42 may be made of any suitable material, such as Ru/Au, Ni/Au or indium-tin-oxide (ITO). A p-type electrode 44 is then formed on one side of the transparent conductive layer 42. Suitable p-type electrode materials include Ni/Au, Pd/Au, Pd/Ni and Pt. A p contact pad 46 is then formed on the p-type electrode 44. Beneficially, the p contact pad 46 is Au. The transparent conductive layer 42, the p-GaN layer 40, the active layer 38 and part of the n-GaN layer 36 are then etched to form a step. Because of the difficulty of wet etching GaN, a dry etch is beneficially usually used to form the step. The LED 30 is then completed by forming an n-electrode pad 48 (such as Cr or Au) and an n contact pad 50 (such as Au) on the step.

FIG. 3 illustrates an alternative blue LED, specifically a vertical topology GaN-based LED 54. An example of this alternative blue LED structure is disclosed in U.S. application Ser. No. 09/905,969 entitled "DIODE HAVING HIGH BRIGHTNESS AND METHOD THEREOF" filed on Jul. 17, 2001, and U.S. application Ser. No. 09/983,994 entitled "DIODE HAVING VERTICAL STRUCTURE AND METHOD OF MANUFACTURING THE SAME" filed on Oct. 26, 2001, both of which are incorporated in this application as if fully set forth herein. The LED 54 is partially fabricated on a sapphire substrate that is subsequently removed. Removal of sapphire substrate may be done by, for example, laser lift-off. As shown, the LED 54 includes a GaN buffer layer 55 having an n-metal contact 56 on a bottom surface and a relatively thick n-GaN layer 58 on the other. The n-metal contact 56 is beneficially formed from a high reflective layer that is overlaid by a high conductivity metal (beneficially Au) to form an n contact pad 57. An active layer 60 having a multiple quantum well is formed on the n-type GaN layer 58, and a p-GaN layer 62 is formed on the active layer 60. A transparent conductive layer 64 is then formed on the p-GaN layer 62, and a p-type electrode 66 is formed on the transparent conductive layer 64. A p contact pad 68 is then formed on the p-type electrode 66.

The vertical GaN-based LED 54 has advantages in that step etching is not required. However, to locate the n-metal contact 56 below the GaN buffer layer 55, the sapphire substrate (not shown) that is used for initial GaN growth is removed. Sapphire substrate removal using laser lift-off is known, reference U.S. Pat. No. 6,071,795 to Cheung et al., entitled, "Separation of Thin Films From Transparent Substrates By Selective Optical Processing," issued on Jun. 6, 2000, and Kelly et al. "Optical process for liftoff of group III-nitride films", Physica Status Solidi (a) vol. 159, 1997, pp. R3-R4). Furthermore, highly advantageous methods of fabricating GaN semiconductor layers on sapphire (or other insulating and/or hard) substrates are taught in U.S. patent application Ser. No. 10/118,317 entitled "A Method of Fabricating Vertical Devices Using a Metal Support Film" and filed on Apr. 9, 2002 by Myung CheolYoo, and in U.S. patent application Ser. No. 10/118,316 entitled "Method of Fabricating Vertical Structure" and filed on Apr. 9, 2002 by Lee et al. Additionally, a method of etching GaN and sapphire (and other materials) is taught in U.S. patent application Ser. No. 10/118,318 entitled "A Method to Improve Light Output of GaN-Based Light Emitting Diodes" and filed on Apr. 9, 2002 by Yeom et al., all of which are hereby incorporated. by reference as if fully set forth herein.

In principle, the vertical GaN-based LED 54 is preferred. Reasons for this include the fact that a 2" diameter sapphire wafer has the potential to produce about 35,000 vertical GaN-based LEDs, but only about 12,000 lateral GaN-based LEDs. Furthermore, the lateral topology is more vulnerable to static electricity, primarily because the two electrodes/pads (44/46 and 48/50) are close together. Additionally, as the lateral topology is fabricated on an insulating substrate, and as the vertical topology can be attached to a heat sink, the lateral topology has relatively poor thermal dissipation.

While the vertical GaN-based LED 54 will be preferred in many applications, at the present time, lateral topology blue LED chips 30 are more common. Furthermore, the principles of the present invention are fully applicable to both types of blue LEDs (as well as with hybrids and variations). Therefore, without implying any loss of generality, the subsequent description of the fabrication of single-element white LEDs will make specific reference to the use of a lateral blue-LED chip 30.

Figure 4:
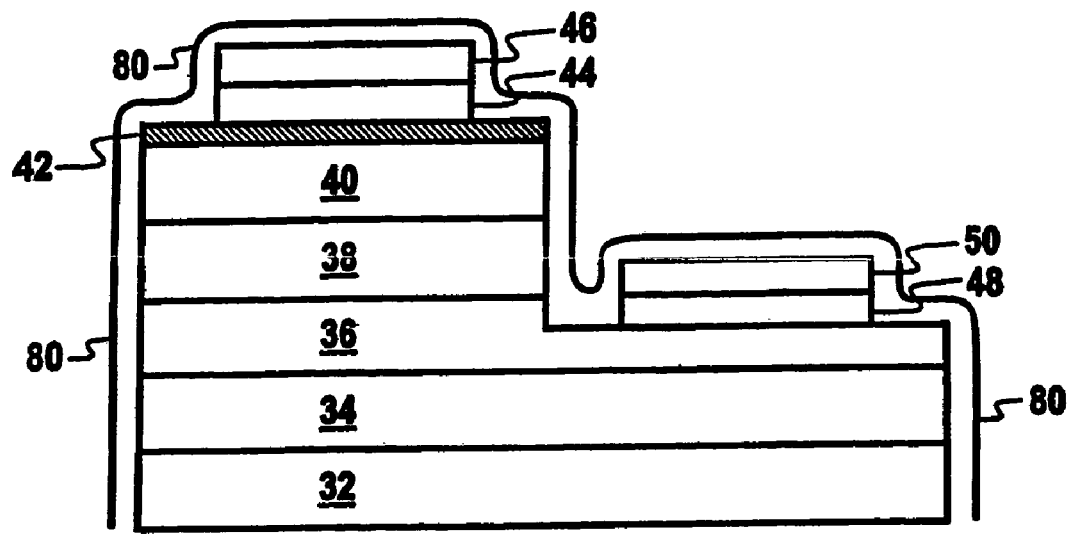
FIG. 4 illustrates a vertical topology, blue LED after coating with a passivation material.

Referring now to FIG. 4, a passivation layer 80 is formed over the blue LED chip 30. A suitable passivation layer 80 may be an $SiO_2$ or $Si_xN_y$ layer of 1000 Å-thick, for example, formed on exposed surfaces of the LED chip 30 using PECVD. Alternatively, the passivation layer 80 may be formed by sputtering, electron beam evaporation, or by coating with a suitable protective material, such as epoxy or flowable $SiO_2$. Note that spin-coating is a particularly useful coating technique. However, PECVD is beneficial because it can form the passivation layer 80 on the sidewalls of the blue LED chip 30.

Figure 5:
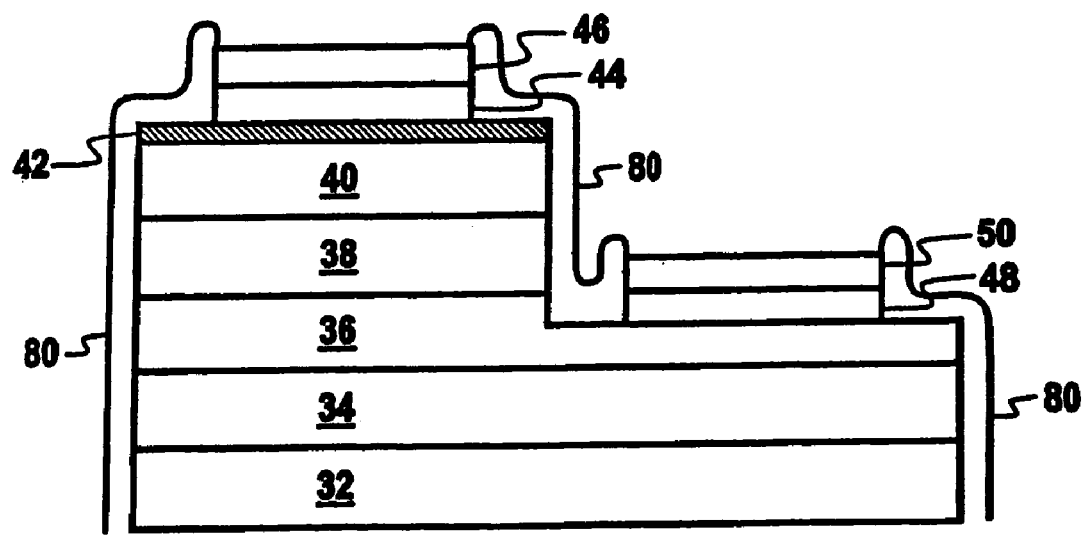
FIG. 5 illustrates the LED of FIG. 4 after patterning of the passivation material.

Referring now to FIG. 5, the passivation layer 80 is then patterned to expose the p and n contact pads 46 and 50 using a suitable etchant. For example, BOE, HF, and/or photo-resist stripping can be used to expose the pads.

Figure 6:
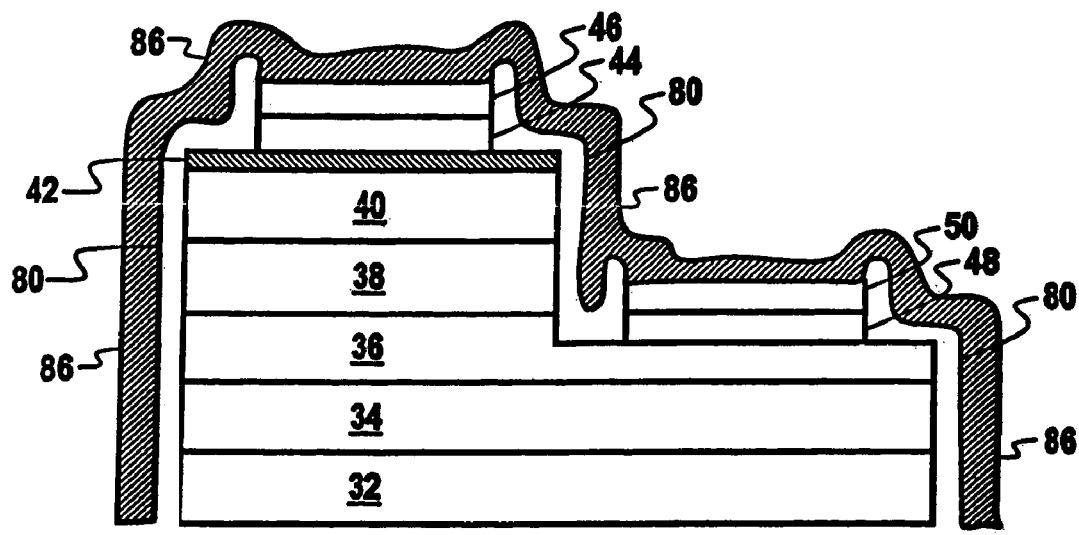
FIG. 6 illustrates the LED of FIG. 5 after forming of a thin film.

Then, as shown in FIG. 6, a thin film layer 86 of, for example, a fluorescent material (such as phosphor or a tin-containing compound) is formed on the passivation layer 80 so as to cover the blue LED element. Other suitable materials can be used for the thin film layer 86 to convert a light of first wavelength (a first color) to a light of second wavelength (a second color). Here, if a blue LED is used and coated with a phosphor thin film, for example, in accordance with the present invention, the blue light would be converted to white light by the phosphor, thus producing an "on-chip" white LED. Using different color LEDs and different color influencing materials would result in different colors produced directly from the chip.

The thin film layer is beneficially formed using metal organic chemical vapor deposition (MOCVD), atomic layer chemical vapor deposition (ALD), plasma enhanced MOCVD, plasma enhanced ALD, photo enhanced CVD, or other chemical vapor deposition methods. Preferably, the thin film layer 86 is about 10 μm or so thick. Thus, the thin film layer 86 is an integral element of the chip, and not part of a package. Regarding the film thickness, in general the thinner the better. The thickness can be reduced by growing dense thin film layers.

Figure 7:
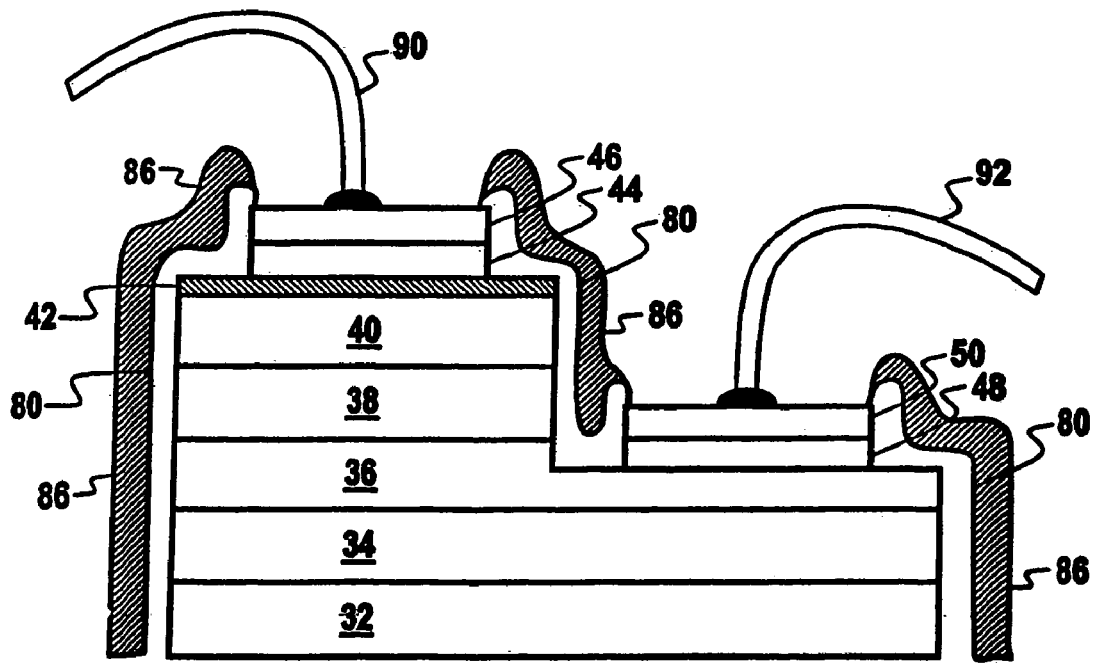
FIG. 7 illustrates the LED of FIG. 6 after patterning of the thin film and after bonding wires are connected.

Referring now to FIG. 7, the thin film layer 86 is patterned to expose the p and n contact pads 46 and 50 using a suitable solvent (which will depend on the composition of the thin film layer 86). Bonding wires 90 and 92 are then bonded to the p and n contact pads 46 and 50, respectively.

Figure 8:
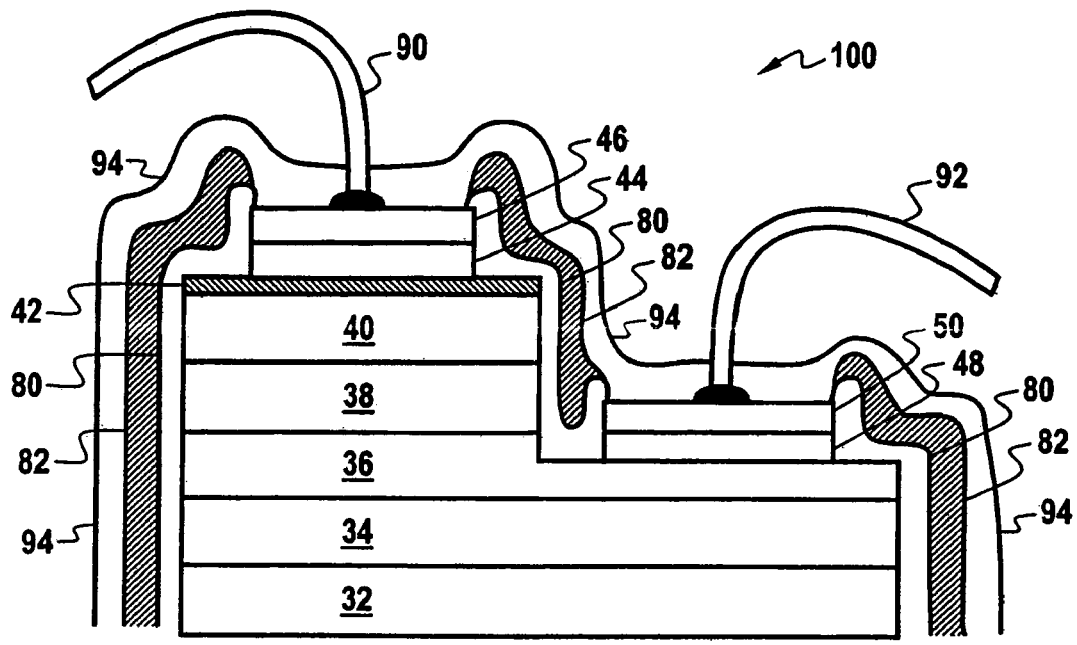
FIG. 8 illustrates the LED of FIG. 7 after a second coating of a passivation material.

Referring now to FIG. 8, an optional second passivation layer 94 (which is optically transparent) is then formed over the structure of FIG. 7. Beneficially the first and second passivation layers 80 and 94 are formed using the same process. The result is a white LED 100.

The white LED 100 can then be encapsulated into a package, such as a lamp package or a surface mount package. However, the white LED 100 also can be used unpackaged and/or as part of another assembly.

Figure 9:
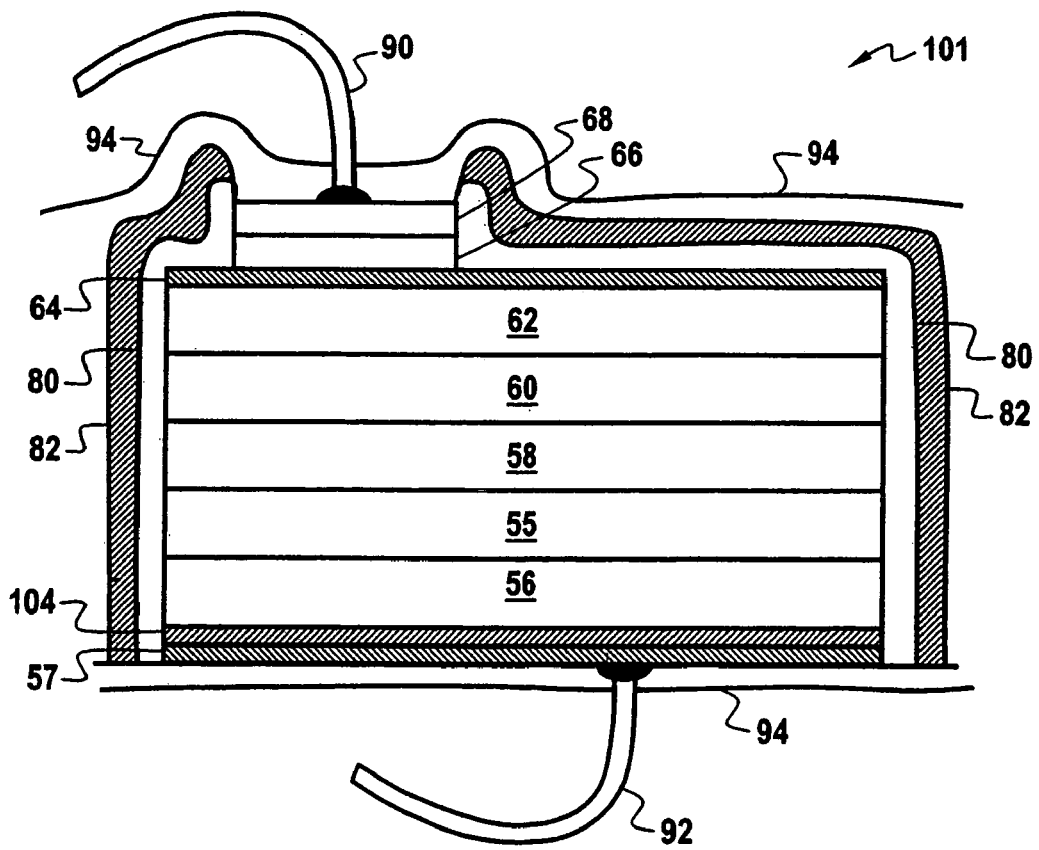
FIG. 9 illustrates an alternative embodiment LED that is in accord with the principles of the present invention.

In some applications it will be beneficial to incorporate a reflector between a contact pad and an adjacent semiconductor layer. For example, as shown in FIG. 9, if a vertical LED 54 is used as the blue light source for a white LED 101, it might be advantageous to incorporate a reflective layer 104 between the n-metal contact 56 and the n contact pad 57. In that case, it is advantageous to include the second passivation layer 94 under the n contact pad 57 after the bonding wire 92 is attached. Likewise, the second passivation layer 94 is beneficially over the p contact pad 68. However, is should be understood that in all cases the second passivation layer 94 is optional.

The foregoing embodiments have described new, useful, and nonobvious white LEDs 101. However, the general principles of depositing thin films that change the color of input light, such as by a thin film material, are applicable to more than just white LEDs. It is entirely possible to implement LEDs that emit other then white light by depositing various thin film materials on LEDs that emit light of different colors. Therefore, while the embodiments and examples set forth herein are presented to best explain the present invention and its practical application and to thereby enable those skilled in the art to make and utilize the invention, others who are skilled in the art will recognize that the foregoing description and examples have been presented for the purpose of illustration and example only.

What is claimed is:

1. A method of fabricating an LED, comprising:
providing an LED chip that emits light at a first wavelength, wherein the LED chip includes a first electrical contact and a second electrical contact;
forming a passivation layer over the LED chip; and
forming a thin film layer uniformly in thickness over the passivation layer, wherein the thin film layer interacts with the light to form light having a second wavelength, wherein the thin film layer includes at least one material selected from a group consisting of a fluorescent material, a tin-containing material, and a phosphor, wherein the thin film layer has first and second openings corresponding to and exposing the first and second electrical contacts, respectively.

2. The method of fabricating an LED according to claim 1, wherein forming the thin film layer includes depositing yttrium-aluminum garnet.

3. The method of fabricating an LED according to claim 1, wherein forming the thin layer includes chemical vapor deposition.

4. The method of fabricating an LED according to claim 1, wherein the passivation layer includes at least one compound selected from a group of compounds consisting of Silicon, Oxide, and Nitride.

5. The method of fabricating an LED according to claim 1, further including forming a second passivation layer over the thin film layer.

6. The method of fabricating an LED according to claim 1, further including bonding a first bonding wire to the first electrical contact and bonding a second bonding wire to the second electrical contact.

7. The method of fabricating an LED according to claim 1, further including sealing the LED chip in a package after forming the thin film layer over the LED chip.

8. The method of fabricating an LED according to claim 7, further including sealing the LED chip after forming the thin film layer over the LED chip in a dome-shaped package.

9. The method of fabricating an LED according to claim 1, wherein the thickness of the thin film layer is about 10 μm or so thick.

10. The method of fabricating an LED according to claim 1, wherein the LED chip emits blue light.

11. A method of fabricating an LED, comprising:
providing an LED chip that emits light at a first wavelength, the LED chip comprising a semiconductor structure having a first surface and a second surface, a first electrical contact on the first surface, and a second electrical contact on the surface, wherein the first electrical contact and the second electrical contact are located over the opposite surfaces of the semiconductor structure;
forming a passivation layer over the first surface and side surfaces of the LED chip; and
forming a thin film over the passivation layer, wherein the thin film interacts with the light to form light having a second wavelength, wherein the thin film includes at least one material selected from a group of materials consisting of a fluorescent material, a tin-containing material, and a phosphor, and wherein the thin film has an opening corresponding to and exposing the first electrical contact.

12. The method of fabricating an LED according to claim 1, wherein the thin film layer is an integral element of the LED chip.

13. The method of fabricating an LED according to claim 1 further includes patterning the thin film layer to expose at least one of the first electrical contact and the second electrical contact.

14. The method of fabricating an LED according to claim 1, wherein the thickness of the passivation layer is about 1000 Å.

15. The method of fabricating an LED according to claim 11, wherein the thin film is formed with a uniform thickness over the passivation layer.

16. The method of fabricating an LED according to claim 11, wherein the opening is configured to prevent the thin film from making contact wit a bonding wire electrically connected to the first electrical contact.

17. The method of fabricating an LED according to claim 11, further including forming a passivation layer over the LED chip.

18. The method of fabricating an LED according to claim 11, wherein the passivation layer includes at least one compound selected from a group of compounds consisting of Silicon, Oxide, and Nitride.

19. The method of fabricating an LED according to claim 11, further including forming a second passivation layer over the thin film.

20. The method of fabricating an LED according to claim 11 further includes patterning the tin film to expose the first electrical contact.

21. The method of fabricating an LED according to 11, wherein the thin film is formed over the entire surface of the passivation layer.

22. The method of fabricating an LED according to claim 11, wherein the opening is configured to provide a location for an external electrical connection.

23. A method of fabricating an LED, comprising:
providing an LED chip that emits light at a first wavelength, the LED chip comprising a semiconductor structure having a first surface and a second surface, a first electrical contact on the first surface, and a second electrical contact on the second surface, wherein the first electrical contact and the second electrical contact are located over the opposite surfaces of the semiconductor structure;
forming a passivation layer over the first surface and side surfaces of the LED chip; and
forming a thin film over the passivation layer, wherein the thin film interacts with the light to form light having a second wavelength, and wherein the thin film has an opening corresponding to and exposing the first electrical contact connected electrically to a bonding wire.

24. The method of fabricating an LED according to claim 23, wherein the thin film is formed with a uniform thickness over the passivation layer.

25. The method of fabricating an LED according to claim 23, wherein the thin film is formed over the entire surface of the passivation layer.

* * * * *